(12) United States Patent
Chou et al.

(10) Patent No.: US 7,479,811 B2
(45) Date of Patent: Jan. 20, 2009

(54) SAMPLE/HOLD CIRCUIT MODULE

(75) Inventors: Chia-Hua Chou, Sindian (TW);
Tse-Hsiang Hsu, Hsin-Chu (TW)

(73) Assignee: Mediatek Inc., Hsin-Chu (TW)

( * ) Notice: Subject to any disclaimer, the term of this patent is extended or adjusted under 35 U.S.C. 154(b) by 0 days.

(21) Appl. No.: 11/456,981

(22) Filed: Jul. 12, 2006

(65) Prior Publication Data

US 2007/0052452 A1    Mar. 8, 2007

Related U.S. Application Data

(60) Provisional application No. 60/715,030, filed on Sep. 8, 2005.

(51) Int. Cl.
*H03K 17/00* (2006.01)
(52) U.S. Cl. .......................... 327/94; 327/95
(58) Field of Classification Search ....................... None
See application file for complete search history.

(56) References Cited

U.S. PATENT DOCUMENTS

| | | | |
|---|---|---|---|
| 6,307,425 B1 * | 10/2001 | Chevallier et al. ............ | 327/536 |
| 6,762,627 B1 * | 7/2004 | Gater ........................... | 327/58 |
| 7,088,613 B2 * | 8/2006 | Lue et al. ..................... | 365/175 |
| 2002/0175738 A1 * | 11/2002 | Cyrusian ..................... | 327/337 |
| 2005/0281168 A1 | 12/2005 | Liu .............................. | 369/100 |
| 2007/0165442 A1 * | 7/2007 | Hosoi et al. .................. | 365/100 |

OTHER PUBLICATIONS

"High-Voltage Regulation and Process Considerations for High-Density 5 V-Only E2PROM's" Skupnjak et al., 1983.
"Wordline Voltage Generating System for Low-Power Low-Voltage Flash Memories" Tanzawa et al., 2001.

* cited by examiner

*Primary Examiner*—Tuan T Lam
*Assistant Examiner*—Hiep Nguyen
(74) *Attorney, Agent, or Firm*—Thomas, Kayden, Horstemeyer & Risley

(57) ABSTRACT

A sample/hold circuit module. The sample/hold circuit module comprises a sample/hold circuit, an S/H controller, a pass transistor, and a high voltage generator. The sample/hold circuit comprises a capacitor and a sampling switch. The capacitor has a first electrode coupled to a first fixed voltage and a second electrode coupled to an output node of the sample/hold circuit module. The sampling switch comprises an output terminal coupled to the second electrode of the capacitor, an input terminal, and a control terminal. The S/H controller is coupled between the control terminal of the sampling switch and a second fixed voltage. The pass transistor has a sampling input terminal, an output terminal coupled to the input terminal of the sampling switch, and a control terminal. The high voltage generator is coupled between the control terminal of the pass transistor and the second fixed voltage.

19 Claims, 6 Drawing Sheets

SAMPLE/HOLD CIRCUIT MODULE

This application claims the benefit of U.S. Provisional Application No. 60/715,030, filed on Sep. 8, 2005.

BACKGROUND OF THE INVENTION

Background

The invention relates to a sample/hold circuit and, in particular, to a sample/hold circuit module using a pass transistor as a clamping switch.

In electronics, a sample and hold circuit is used to interface real-world, changing analog signals to a subsequent system such as an analog-to-digital converter. The purpose of this circuit is to hold the analog value steady for a short time while the converter or other following system performs some operations that take a little time.

In most circuits, a capacitor is used to store the analog voltage, and an electronic switch or gate is used to alternately connect and disconnect the capacitor from the analog input. The rate at which this switch is operated is the sampling rate of the system.

The necessity of such a circuit is easy to see if one considers what would happen if it were not present. In some kinds of ADC for example, the input is often compared to a voltage generated internally from a digital-to-analog converter. The circuit tries a series of values, and stops converting once the voltages are "the same" within some defined error margin. If the input value was permitted to change during this comparison process, the resulting conversion would be inaccurate, and possibly completely unrelated to the true input value.

SUMMARY

An embodiment of a sample/hold circuit module comprises a sample/hold circuit, an S/H controller, a pass transistor, and a high voltage generator. The sample/hold circuit comprises a capacitor and a sampling switch. The capacitor has a first electrode coupled to a first fixed voltage and a second electrode coupled to an output node of the sample/hold circuit module. The sampling switch comprises an output terminal coupled to the second electrode of the capacitor, an input terminal, and a control terminal. The S/H controller is coupled between the control terminal of the sampling switch and a second fixed voltage. The pass transistor has a sampling input terminal, an output terminal coupled to the input terminal of the sampling switch, and a control terminal. The high voltage generator is coupled between the control terminal of the pass transistor and the second fixed voltage.

BRIEF DESCRIPTION OF THE DRAWINGS

FIG. 5B shows waveforms of signals at the input terminal and an

DETAILED DESCRIPTION

Figure 1:
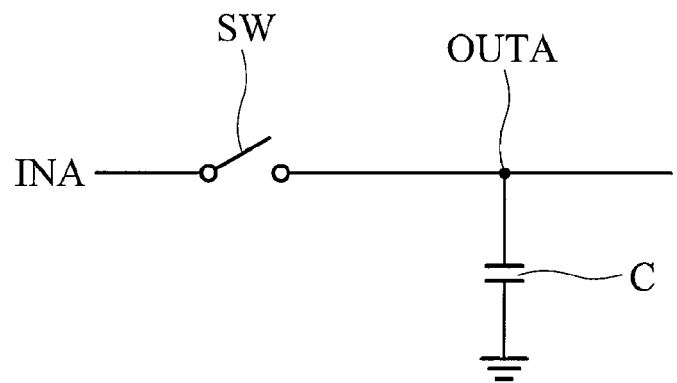
FIG. 1 is a schematic diagram of a sample/hold (S/H) circuit.

FIG. 1 is a schematic diagram of a sample/hold (S/H) circuit. The sample/hold circuit comprises a sampling switch SW and a capacitor C. The capacitor C is coupled between an output terminal OUTA of the sample/hold circuit and a ground. The sampling switch SW is coupled between an input terminal INA of the sample/hold circuit and the output terminal OUTA. When the sampling switch is closed, the input signal at the input terminal is transmitted to the output terminal OUTA. When the sampling switch is open, the instantaneous value of the input signal is frozen across the capacitor C.

Figure 2:
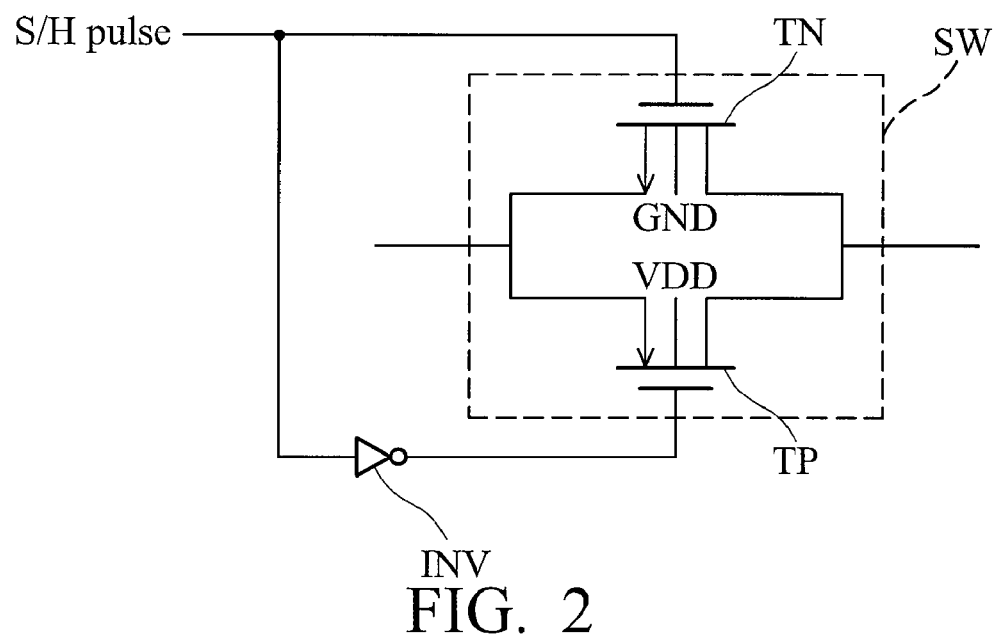
FIG. 2 is a schematic diagram of a sampling switch in FIG. 1.

FIG. 2 is a schematic diagram of a sampling switch in FIG. 1. The sampling switch is a complementary switch allowing rail-to-rail swings. The complementary switch comprises a PMOS transistor TP and an NMOS transistor TN. Sources of the PMOS and NMOS transistors are tied together, as are drains thereof. A gate of the NMOS transistor TN is directly controlled by a S/H pulse. A gate of the PMOS transistor TP is indirectly controlled by the S/H pulse via an inverter INV.

Figure 3:
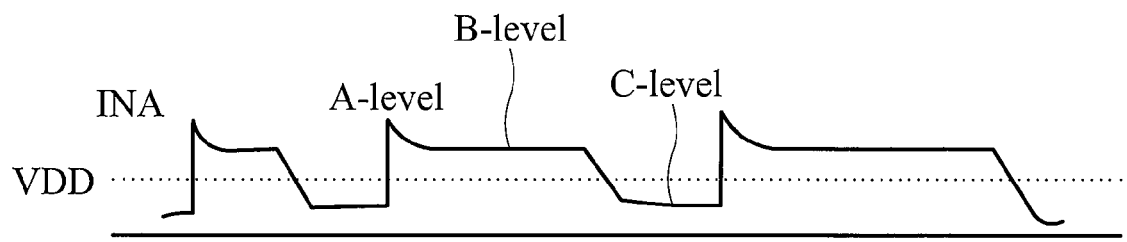
FIG. 3 is a waveform of the input signal at the input terminal INA in FIG. 2.
Figure 4:
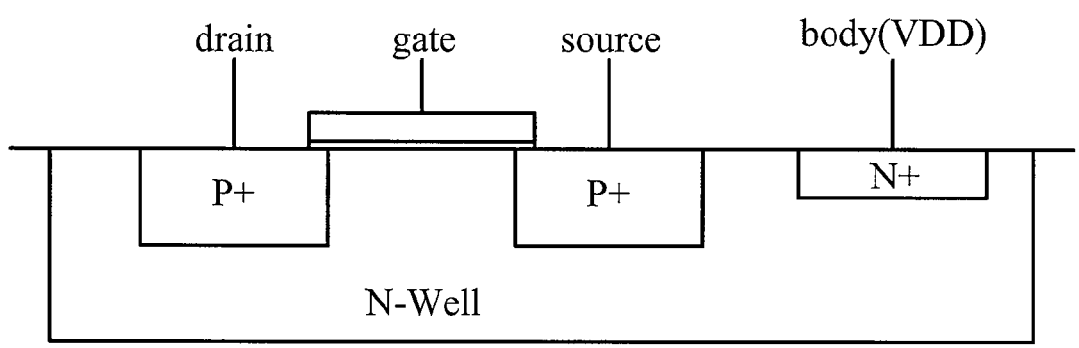
FIG. 4 is a cross section of the PMOS transistor TP in FIG. 2.

FIG. 3 is a waveform of the input signal at the input terminal INA in FIG. 2. There are three voltage levels A, B and C in the waveform, respectively the highest, intermediate, and lowest levels. For some applications, the voltage level B in FIG. 3 may exceed a power supply voltage VDD of an integrated circuit, inducing malfunction of the sample/hold circuit. FIG. 4 is a cross section of the PMOS transistor TP in FIG. 2. If the voltage level A or B exceeds the supply voltage VDD of the integrated by an amount of a diode's turn-on voltage, i.e., the voltage of source/drain of the PMOS transistor TP exceeds the VDD of the chip by a diode's turn on voltage, the p-n junction of the source/drain to n-well is forward-biased. As a result, the voltage of the source/drain is fixed at about (VDD+Vd), wherein Vd is the diode's turn-on voltage, and the signal level cannot be held by the sample-hold circuit.

Figure 5A:
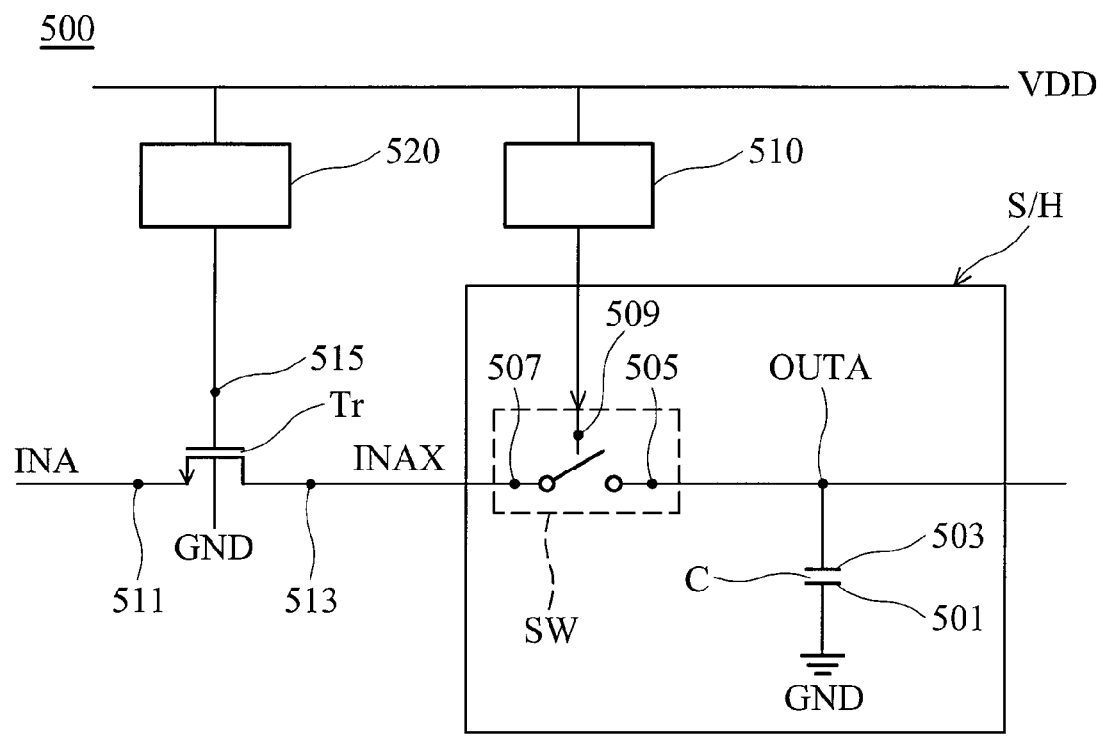
FIG. 5A is a schematic diagram of a sample/hold circuit module according to an embodiment of the invention.

FIG. 5A is a schematic diagram of a sample/hold circuit module according to an embodiment of the invention. The sample/hold circuit module 500 comprises a sample/hold circuit S/H, an S/H controller 510, a pass transistor Tr, and a high voltage generator 520. The sample/hold circuit S/H comprises a capacitor C and a sampling switch SW. The capacitor C has a first electrode 501 and a second electrode 503. The first electrode 501 is coupled to a first fixed voltage. The second electrode 503 is coupled to an output node OUTA of the sample/hold circuit module 500. The sampling switch SW comprises an output terminal 505 coupled to the second electrode 503 of the capacitor C, an input terminal 507, and a control terminal 509. The S/H controller 510 is coupled between the control terminal 509 of the sampling switch SW and a second fixed voltage VDD. The pass transistor Tr has a sampling input terminal 511, an output terminal 513 coupled to the input terminal 507 of the sampling switch SW, and a control terminal 515. The high voltage generator 520 is coupled between the control terminal 515 of the pass transistor Tr and the second fixed voltage VDD. In the embodiment, the sampling switch SW in the sample/hold circuit S/H can be a PMOS transistor, an NMOS transistor, or a complementary switch. In addition, the pass transistor is a PMOS transistor or an NMOS transistor. Preferably, the first and second fixed voltages are respectively a power supply voltage VDD and a ground GND.

Figure 5B:
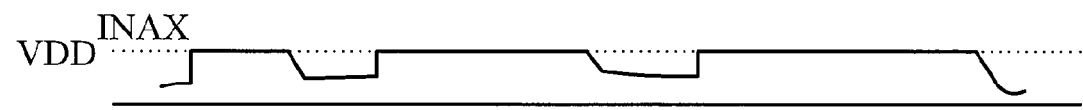

A pass transistor Tr is added in front of the sample/hold circuit S/H and a high voltage Vh~(VDD+Vt), wherein Vt is the threshold voltage of the pass transistor Tr, applied at the control terminal 515 thereof. As shown in FIG. 5B, maximum of a voltage INAX at the output terminal 513 of the pass transistor Tr is clamped at VDD and the voltage INAX is then sampled and held by the sample/hold circuit S/H. Since the voltage level of INAX is always below the VDD of the integrated circuit, the sample/hold circuit S/H can function normally.

Figure 6:
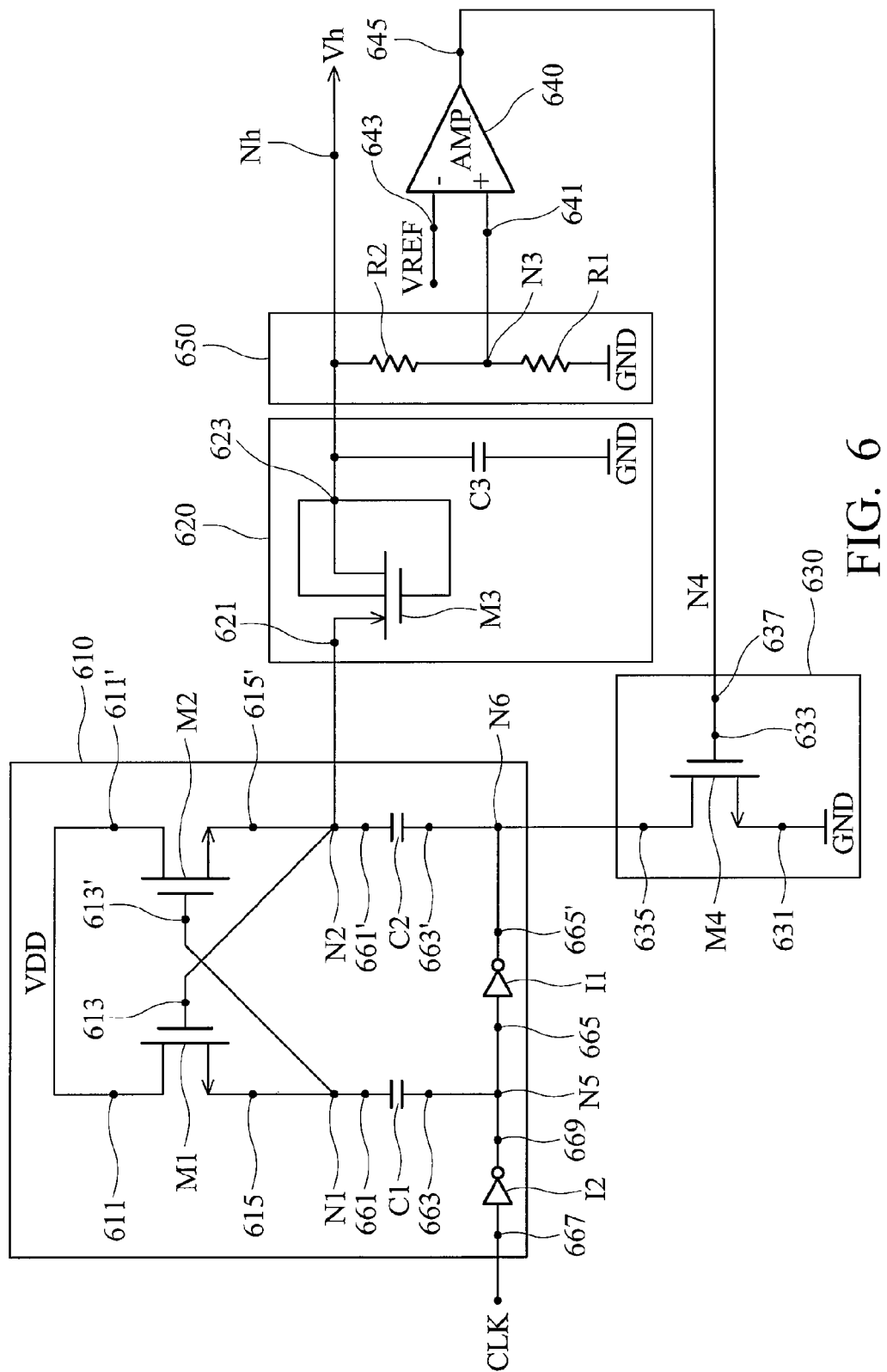
FIG. 6 is a schematic diagram of the high voltage generator 520 in FIG. 5A.

FIG. 6 is a schematic diagram of an embodiment of the high voltage generator 520 in FIG. 5A. The high voltage generator 520 comprises a bootstrap circuit 610, a low pass filter 620, a voltage controlled current source 630, an amplifier 640, and a voltage divider 650. The high voltage generator 520 provides a high voltage Vh exceeding VDD to an output node Nh, connected to the control terminal of the pass transistor. The bootstrap circuit 610 is coupled between the second fixed voltage VDD and the voltage controlled current source 630. The bootstrap circuit 610 receives a clock signal CLK and pumps up the second fixed voltage VDD as a pumped-up signal at an internal node N2. The low pass filter 620 is coupled between the bootstrap circuit 610 and the output node Nh. The pumped-up signal is received and smoothed by the low pass filter 620, thereby generating a stable high voltage Vh at the output node Nh. The voltage controlled current source 630 is coupled between the bootstrap circuit 610 and the first fixed voltage GND. In addition, the voltage controlled current source 630 has a voltage controlled terminal 637. The amplifier 640 has a non-inverting terminal 641, an inverting terminal 643, and an output terminal 645. The inverting terminal 643 receives a reference voltage VREF and the output terminal 645 is coupled to the voltage controlled terminal 637. The voltage divider 650 is coupled to the output node Nh and the non-inverting terminal 641 of the amplifier 640. The high voltage Vh is sampled by the voltage divider 650. The sampled voltage is transmitted to the non-inverting terminal 641 of the amplifier 640. The difference of the sampled voltage and the reference voltage VREF is amplified by the amplifier 640 to control current through the voltage controlled current source 630. The amount of current of the voltage controlled current source 630 determines voltage of the internal node N6. The voltage of the internal node N6 further determines the pumped-up voltage. As a result, the high voltage Vh is fine-tuned through the feedback loop.

In FIG. 6, the low pass filter 630 comprises a resistor and a capacitor C3. More specifically, the resistor is a MOS transistor M3. The resistor has a first terminal 621 coupled to the internal node N2 of the bootstrap circuit 610 and a second terminal 623 coupled to the output node Nh. The capacitor C3 is coupled between the second terminal 623 of the resistor and the first fixed voltage GND. The voltage divider comprises two resistors R1 and R2 coupled in series between the output node Nh and the first fixed voltage GND. In addition, the voltage controlled current source 630 is a MOS transistor M4. The MOS transistor M4 has a gate 633 coupled to the voltage controlled terminal 637, a source 631 coupled to the first fixed voltage GND, and a drain 635 coupled to the internal node N6 of the bootstrap circuit 610.

In addition, the bootstrap circuit 610 comprises a MOS transistor pair M1 and M2, a capacitor pair C1 and C2, a first inverter I1, and a second inverter I2. The MOS transistor pair M1 and M2 has drains 611 and 611' coupled to the second fixed voltage VDD, and gates 613 and 613' cross-coupled to sources 615 and 615' of the MOS transistor pair M1 and M2. The capacitor pair C1 and C2 has first terminals 661 and 661' respectively coupled to the sources 615 and 615' of the MOS transistor pair M1 and M2. The first inverter I1 has input and output terminals 665 and 665' respectively coupled to second terminals 663 and 663' of the capacitor pair C1 and C2. The second inverter I2 has an input terminal 667 receiving the clock signal CLK and an output terminal 669 coupled to the input terminal 665 of the first inverter I1. The source 615' of the MOS transistor pair M1 and M2 is coupled to the low pass filter 620. The output terminal 665' of the first inverter I1 is coupled to the drain 635 of the MOS transistor M4.

In FIG. 6, the MOS transistor M3, the capacitor C3, the resistors R1 and R2, the amplifier 640, and the NMOS transistor M4 forms a negative feedback loop. Due to a virtual short between the non-inverting and inverting terminals 641 and 643 of the amplifier 640, the high voltage Vh is pinned at VREF×(R1+R2)/R1. The sampled voltage of Vh*R1/(R1+R2) at the non-inverting terminal 641 of the amplifier 640 is compared with the reference voltage VREF and the difference is amplified to control the gate voltage of the MOS transistor M4. The MOS transistor M4 and the first inverter I1 determine the pump voltage of the bootstrap circuit. For example, when Vh*R1/(R1+R2) is higher than VREF, the gate voltage of the MOS transistor M4 is increased and a high state voltage of the internal node N6 is decreased. Since a signal at the internal node N2 is nearly a square wave ranged from VDD to (VDD+Vhi), where Vhi is the high state voltage of the internal node N6, the high voltage Vh is thus decreased. In this way, the high voltage Vh is pinned at VREF*(R1+R2)/R1.

Figure 7:
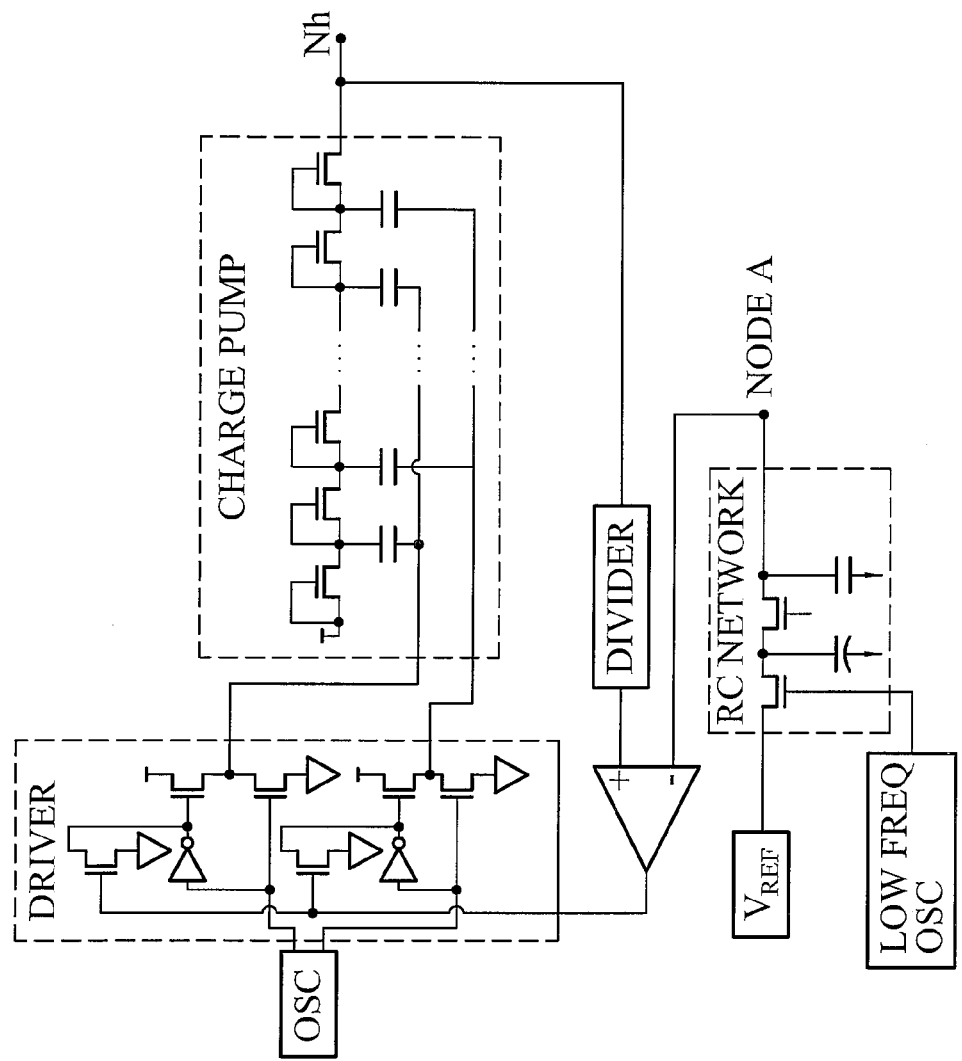
FIG. 7 is a schematic diagram of another embodiment of the high voltage generator 520 in FIG. 5A.

FIG. 7 is a schematic diagram of another embodiment of the high voltage generator 520 in FIG. 5A. The high voltage generator in FIG. 7 is disclosed in "High-Voltage Regulation and Process Considerations for High-Density 5V-Only E$^2$PROM's", IEEE Journal of Solid-State Circuits, Vol. SC-18, No. 5, October 1983 and incorporated herein by reference. In FIG. 7, the high voltage generator provides a high voltage exceeding VDD to an output node Nh thereof.

Figure 8:
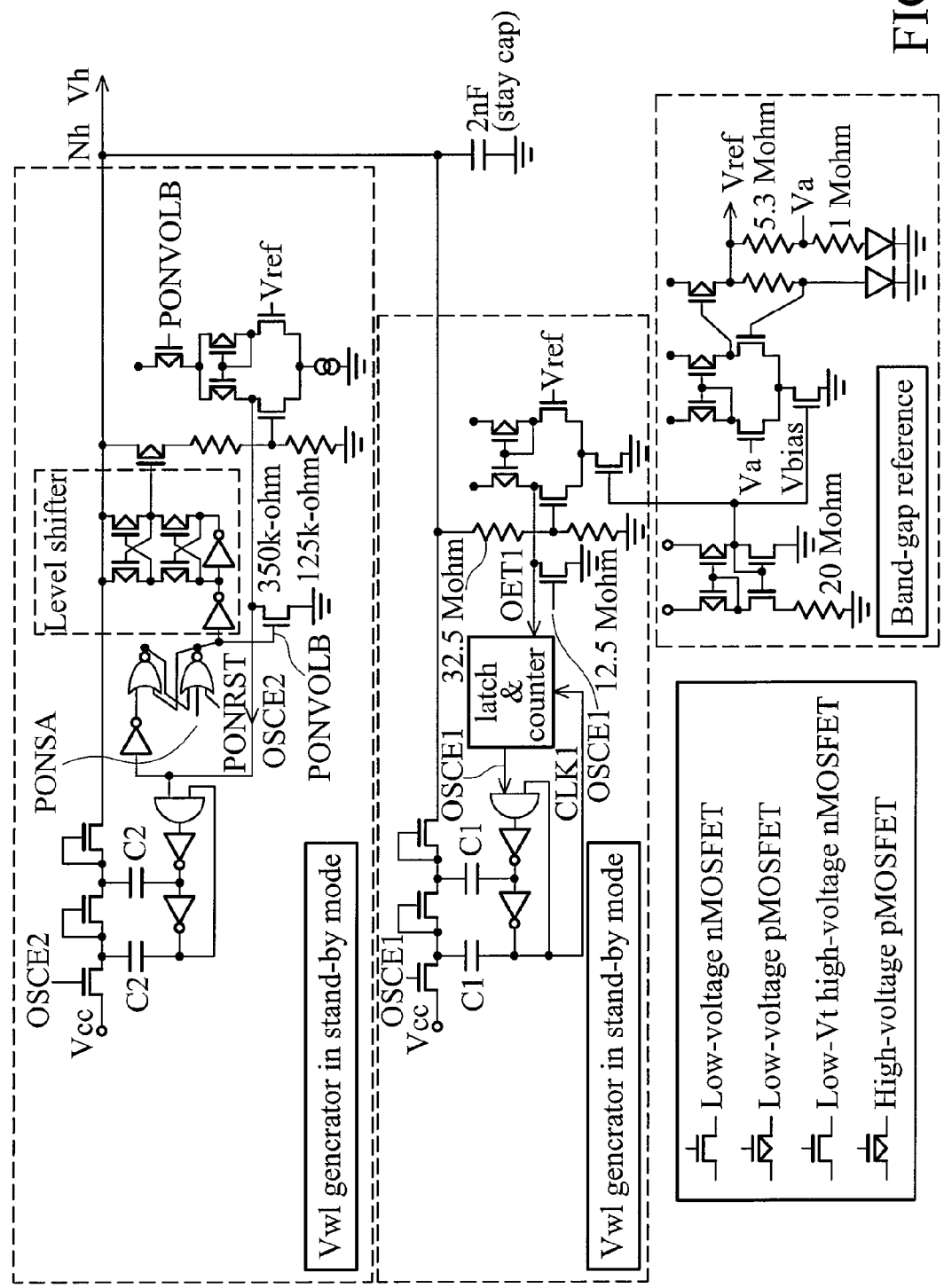
FIG. 8 is a schematic/diagram of yet another embodiment of the high voltage generator 520 in FIG. 5A.

FIG. 8 is a schematic diagram of yet another embodiment of the high voltage generator 520 in FIG. 5A. The high voltage generator in FIG. 8 is disclosed in "Wordline Voltage Generating System for Low-Power Low-Voltage Flash Memories", IEEE Journal of Solid-State Circuits, Vol. 36, No. 1, January 2001 and incorporated herein by reference. In FIG. 8, the high voltage generator provides a high voltage Vh exceeding VDD to an output node Nh thereof.

While the invention has been described by way of example and in terms of preferred embodiment, it is to be understood that the invention is not limited thereto. To the contrary, it is intended to cover various modifications and would be apparent to those skilled in the art. Therefore, the scope of the appended claims should be accorded the broadest interpretation so as to encompass all such modifications.

What is claimed is:

1. A sample/hold (S/H) circuit module, comprising:
   a sample/hold circuit, comprising:
   a capacitor having a first electrode coupled to a fixed voltage and a second electrode coupled to an output node of the sample/hold circuit module; and
   a sampling switch comprising an output terminal coupled to the second electrode of the capacitor, an input terminal, and a control terminal;
   a S/H controller, coupled between the control terminal of the sampling switch and a power supply voltage, controlling the sampling switch;

a pass transistor comprising a sampling input terminal, an output terminal coupled to the input terminal of the sampling switch, and a control terminal; and a high voltage generator, coupled between the control terminal of the pass transistor and the power supply voltage, providing a voltage exceeding the power supply voltage to the pass transistor such that an input signal of the sample/hold circuit is clamped at a voltage lower than the power supply voltage.

2. The sample/hold (S/H) circuit module of claim 1, wherein the sampling switch in the sample/hold circuit is a PMOS transistor.

3. The sample/hold (S/H) circuit module of claim 1, wherein the sampling switch in the sample/hold circuit is an NMOS transistor.

4. The sample/hold (S/H) circuit module of claim 1, wherein the sampling switch in the sample/hold circuit is a complementary switch.

5. The sample/hold (S/H) circuit module of claim 1, wherein the pass transistor is a PMOS transistor.

6. The sample/hold (S/H) circuit module of claim 1, wherein the pass transistor is an NMOS transistor.

7. The sample/hold (S/H) circuit module of claim 1, wherein the high voltage generator comprises:
   a bootstrap circuit, coupled to the power supply voltage, receiving a clock signal and pumping up the power supply voltage as a pumped-up signal;
   a low pass filter, coupled between the bootstrap circuit and the control terminal of the pass transistor, receiving the pumped-up signal;
   a voltage controlled current source, coupled between the bootstrap circuit and the fixed voltage, having a voltage controlled terminal;
   an amplifier having a non-inverting terminal, an inverting terminal receiving a reference voltage, and an output terminal coupled to the voltage controlled terminal; and
   a voltage divider coupled to the control terminal of the pass transistor and the non-inverting terminal of the amplifier.

8. The sample/hold (S/H) circuit module of claim 7, wherein the low pass filter comprises:
   a resistor comprising a first terminal coupled to the bootstrap circuit and a second terminal coupled to the control terminal of the pass transistor; and
   a capacitor coupled between the second terminal of the resistor and the fixed voltage.

9. The sample/hold (S/H) circuit module of claim 8, wherein the resistor is a MOS transistor.

10. The sample/hold (S/H) circuit module of claim 7, wherein the voltage divider comprises two resistors coupled in series between the control terminal of the pass transistor and the fixed voltage.

11. The sample/hold (S/H) circuit module of claim 7, wherein the voltage controlled current source is a MOS transistor.

12. The sample/hold (S/H) circuit module of claim 7, wherein the bootstrap circuit comprises:
   a MOS transistor pair having drains coupled to the power supply voltage, and gates cross-coupled to sources thereof;
   a capacitor pair, with first terminals respectively coupled to the sources of the MOS transistor pair;
   a first inverter, with input and output terminals respectively coupled to second terminals of the capacitor pair; and
   a second inverter comprising an input terminal receiving the clock signal and an output terminal coupled to the input terminal of the first inverter;
   wherein one of the sources of the MOS transistor pair is coupled to the low pass filter and the output terminal of the first inverter is coupled to the voltage controlled current source.

13. The sample/hold (S/H) circuit module of claim 1, wherein the fixed voltage is a ground voltage.

14. A sample/hold (S/H) circuit module, comprising:
   a sample/hold circuit, comprising:
   a capacitor coupled to an output node of the sample/hold circuit module; and
   a sampling switch coupled to the output node;
   a S/H controller, coupled to a control terminal of the sampling switch;
   a pass transistor coupled to an input terminal of the sampling switch; and
   a high voltage generator, coupled to a control terminal of the pass transistor;
   wherein the high voltage generator comprises:
   a bootstrap circuit receiving a clock signal and generating a pumped-up signal;
   a low pass filter, coupled between the bootstrap circuit and the control terminal of the pass transistor, receiving the pumped-up signal;
   a voltage controlled current source, coupled between the bootstrap circuit and the first fixed voltage, having a voltage controlled terminal;
   an amplifier having a non-inverting terminal, an inverting terminal receiving a reference voltage, and an output terminal coupled to the voltage controlled terminal; and
   a voltage divider coupled to the control terminal of the pass transistor and the non-inverting terminal of the amplifier.

15. The sample/hold (S/H) circuit module of claim 14, wherein the low pass filter comprises:
   a resistor comprising a first terminal coupled to the bootstrap circuit and a second terminal coupled to the control terminal of the pass transistor; and
   a capacitor coupled between the second terminal of the resistor and the first fixed voltage.

16. The sample/hold (S/H) circuit module of claim 15, wherein the resistor is a MOS transistor.

17. The sample/hold (S/H) circuit module of claim 14, wherein the voltage divider comprises two resistors coupled in series between the control terminal of the pass transistor and the fixed voltage.

18. The sample/hold (S/H) circuit module of claim 14, wherein the voltage controlled current source is a MOS transistor.

19. The sample/hold (S/H) circuit module of claim 14, wherein the bootstrap circuit comprises:
   a MOS transistor pair having drains coupled to the second fixed voltage, and gates cross-coupled to sources thereof;
   a capacitor pair, with first terminals respectively coupled to the sources of the MOS transistor pair;
   a first inverter, with input and output terminals respectively coupled to second terminals of the capacitor pair; and
   a second inverter comprising an input terminal receiving the clock signal and an output terminal coupled to the input terminal of the first inverter;
   wherein one of the sources of the MOS transistor pair is coupled to the low pass filter and the output terminal of the first inverter is coupled to the voltage controlled current source.

* * * * *